United States Patent [19]

Lit et al.

[11] 3,723,823

[45] Mar. 27, 1973

[54] PRINTED CIRCUIT BOARD GUIDE

[75] Inventors: Harry B. Lit, Peabody, Mass.; Mark S. Mazzetti, Los Gatos, Calif.

[73] Assignee: General Electric Company, Lynn, Mass.

[22] Filed: Nov. 30, 1971

[21] Appl. No.: 203,224

[52] U.S. Cl. ..............................317/101 DH, 211/41

[51] Int. Cl. ..............................H02b 1/02

[58] Field of Search ...............317/101 DH; 211/41 LM; 339/17 LM, 339/17 M

[56] References Cited

UNITED STATES PATENTS

| | | | |
|---|---|---|---|
| 3,549,950 | 12/1970 | Shelden | 317/101 DH |
| 3,458,767 | 7/1969 | Hedger et al. | 317/101 DH |
| 3,247,424 | 4/1966 | Kossy et al. | 317/101 DH |

*Primary Examiner*—David Smith, Jr.
*Attorney*—William S. Wolfe

[57] ABSTRACT

A board guide for providing alignment of a printed circuit board with the connector during and after insertion into the connector. The board guide comprises a base having track channels therein slightly wider than the thickness of a printed circuit board. Extending from the base are a pair of L-shaped restraining members and a pair of L-shaped latching members. Each L-shaped latching member terminates in a beveled tooth which cooperates with part of the base and which engages a slotted frame under of a chassis thereby securing the guide device to the chassis. The L-shaped restraining members also cooperate with the base to resist any force applied to the guide device in a direction perpendicular to the plane of the base which might tend to effect the removal of the guide device or otherwise damage the latching members.

6 Claims, 6 Drawing Figures

PRINTED CIRCUIT BOARD GUIDE

BACKGROUND OF THE INVENTION

This invention relates to an improved device for guiding printed circuit boards into a connector.

In the design of modular equipment employing printed circuit boards and associated electrical connectors, it has been found necessary to use board guides to guide circuit contacts on the printed circuit board into the connector. The primary purpose of the board guide is to provide proper alignment of the printed circuit board with the connector during and after insertion of the board into the connector. If a board guide were not utilized, it would be possible for the printed circuit board, it contacts or the mating contacts of the connector to be damaged during the insertion of the printed circuit board into the connector. Once the board has been inserted into the connector, the board guide acts to maintain a proper relationship between the printed circuit board and the connector by preventing undue lateral motion of the board which might put unwanted stress on either the printed circuit board or the connector or perhaps allow components mounted on one printed circuit board to contact printed wire circuitry on the adjacently inserted printed circuit board.

In one type of board guide, individual spacer elements are used as board guides. These individual spacer elements are assembled into a channel member. The channel members with the spacer elements are then fastened to end plates to form a chassis to hold the printed circuit cards. In this type of construction, it is necessary to assemble enough of the spacer elements into the channel at the time of the original assembly to fill the channel even though some of the spacer elements are not needed as board guides. If this were not done, the spacer elements would be free to move laterally within the channel and would not be properly aligned with their respective connectors. Another disadvantage of this requirement is the necessity of maintaining a high dimensional tolerance on each spacer to minimize any tolerance error buildup along the length of the channel. Another disadvantage is the added cost of providing all of the spacers and assembling them when they are not required as board guides.

Another type of board guide overcomes the tolerance buildup problem by individually locating each board guide element. An example of such a board guide is shown in U.S. Pat. No. 3,231,785, by Calabro, wherein each board guide element is attached to channel members, which form part of the chassis, by a contractible fastener at each end of the board guide which is forced into mating apertures in the channel members. One disadvantage of this type of board guide is that it is difficult to install additional board guides in the field. To assemble the board guide in the field, it is necessary to place your hand in the rack and apply pressure to the end of the guide away from your body.

Another disadvantage of some prior art board guides is that they can be removed by applying a force in the direction opposite to the installation force, thereby creating the possibility that they will be accidentally disassembled. Another disadvantage of some prior art board guides is that a continuous force is maintained on the guide to retain it in the assembled position which tends to stress and perhaps weaken the material of the board guide device.

It is, therefore, a principal object of this invention to provide an improved board guide.

It is another object of this invention to provide a multiple board guide device which can easily be assembled in the field.

It is another object of this invention to provide a multiple board guide device that resists accidental removal upon the application of force to the guide device.

It is yet another object of this invention to provide a board guide which is retained in its assembled position without exerting any substantial force on the board guide.

SUMMARY OF THE INVENTION

The board guide of this invention comprises a base having track channels therein slightly wider than the thickness of a printed circuit board. Extending from the base are a pair of L-shaped restraining members and a pair of L-shaped latching members. Each L-shaped latching member terminates in a beveled tooth which cooperates with part of the base and which engages a slotted frame member of a chassis thereby securing the guide device to the chassis. The L-shaped restraining members also cooperate with the base to resist any force applied to the guide device in a direction perpendicular to the plane of the base which might tend to effect the removal of the guide device or otherwise damage the latching members.

DESCRIPTION OF THE DRAWINGS

While the specification concludes with claims particularly pointing out and distinctly claiming that which is regarded as the present invention, the objects and advantages of this invention can be more readily ascertained from the following description of a preferred embodiment when read in conjunction with the accompanying drawings in which:

DETAILED DESCRIPTION

Figures 1, 2:
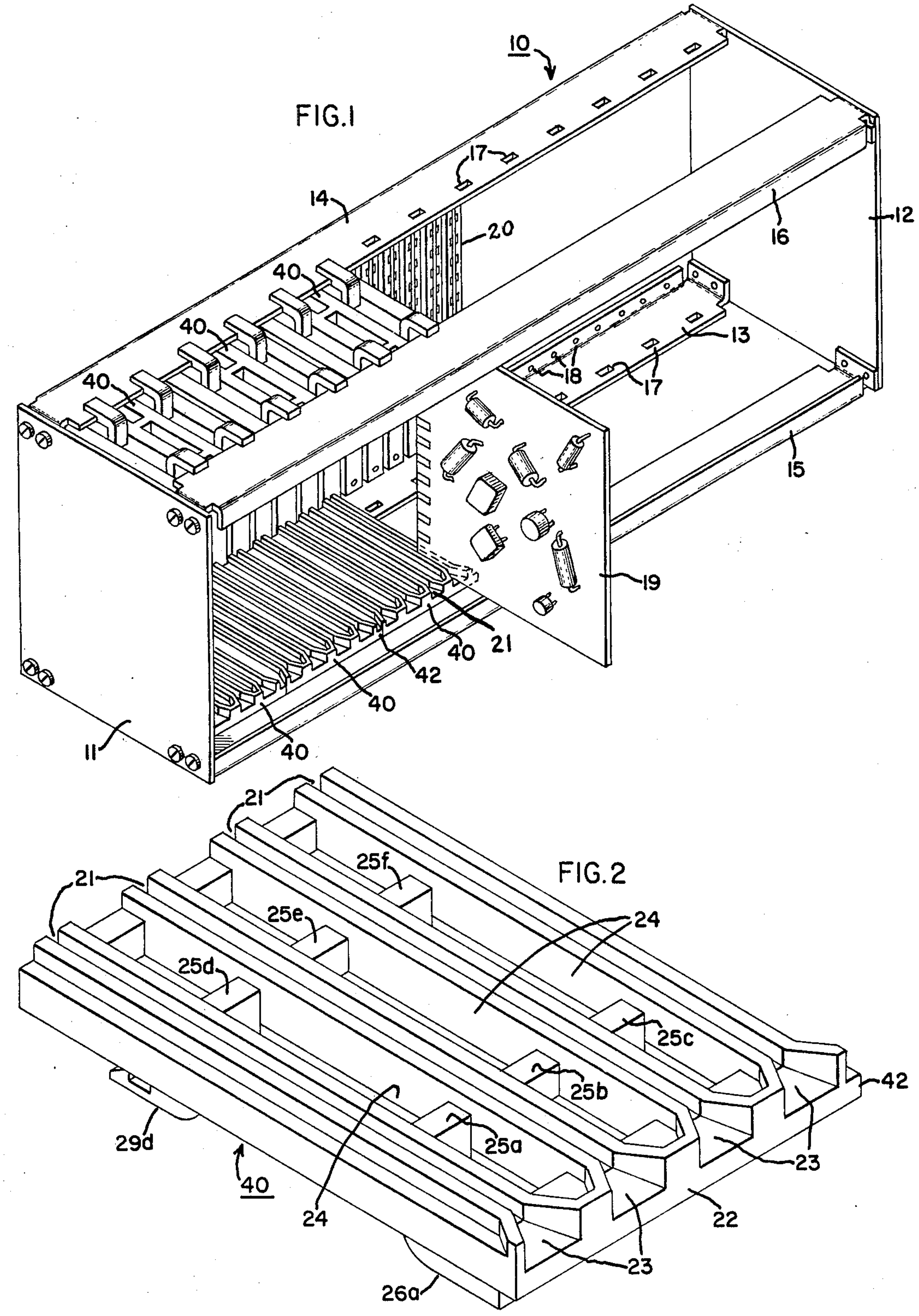
FIG. 1 is a perspective view of a typical printed circuit board chassis using the multiple board guide device described herein.
FIG. 2 is a detailed perspective view of the top of the guide device shown generally in FIG. 1.

FIG. 1 illustrates the use of the guide devices of this invention in a chassis. The chassis 10, as generally shown, comprises a pair of end plates 11 and 12 and four angled frame members 13, 14, 15 and 16 fastened to the end plates. Angle members 13 and 14 contain a number of latching slots 17 in one leg and a number of connector mounting holes 18 in the other leg. The mounting holes 18 are used to mount connectors 20 to the chassis 10, and each latching slot 17 is so placed in relation to each connector mounting hole 18 that the guide track channel 21 of guide device 40 is properly aligned with the mounted connector.

Now referring to FIG. 2, the guide device 40 has a base 22 with four track channels 21 therein. Each track channel 21 is slightly wider than the thickness of a printed circuit board and terminates in a throat 23 which assists the placement of a printed circuit board 19, as shown in FIG. 1, into the track channel 21. Portions of the base 22 between the track channels 21 have been removed to form air slots 24 which allow cooling air to flow between the printed circuit boards when they are assembled into the chassis 10. Ribs 25*a* through 25*f* provide lateral support to the track channels 21. Projection 42 of the base at the insertion end of the guide device acts to maintain a minimum spacing between adjacent guide devices even though excessive force is applied to the guide device during the insertion or extraction of a printed circuit board.

Figure 3:
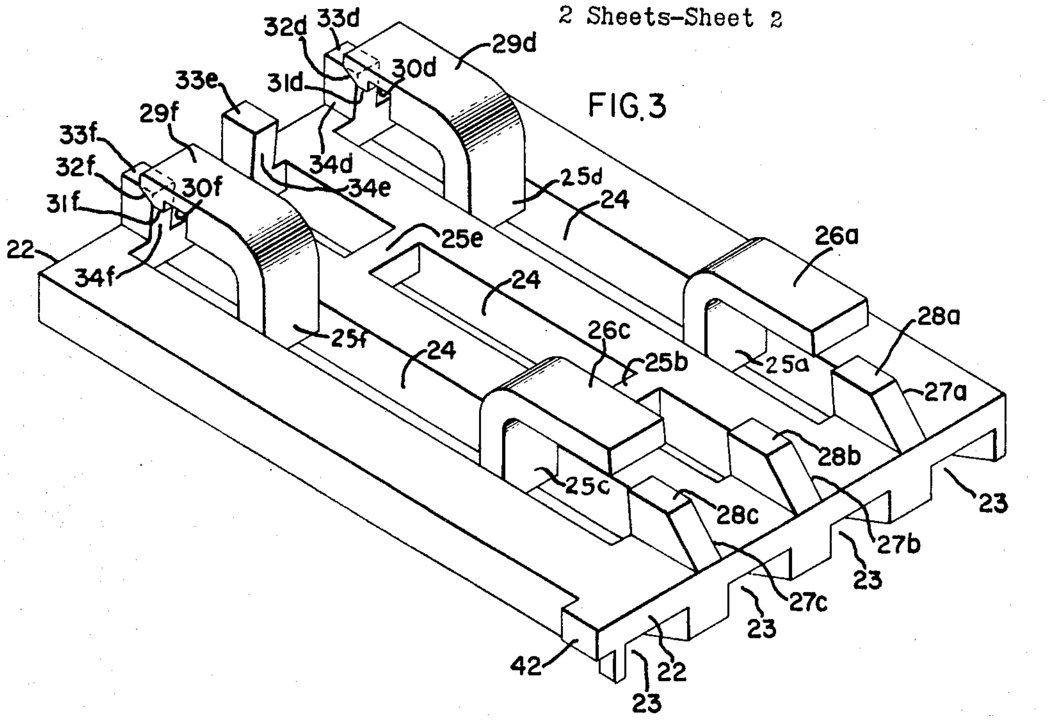
FIG. 3 is a perspective view of the bottom of the guide device of FIG. 1; and FIGS. **4*a*, 4*b* and 4*c* are cross-sectional side views of the guide device of FIG. 3** and progressively depict its assembly into a chassis.

Now referring to FIG. 3, ribs 25*a* and 25*c* terminate in angular restraining members 26*a* and 26*c*. The feet 28*a*, 28*b* and 28*c* of legs 27*a*, 27*b* and 27*c* which extend downward from the base 22 provide a restraining surface which cooperates with the restraining members 26*a* and 26*c* and with the angled members of the chassis 10 to prevent substantial movement of the guide device 40 in a direction perpendicular to the plane of its base when it is assembled into the chassis 10. Ribs 25*d* and 25*f* terminate in angular latching members 29*d* and 29*f*. A notch 30*d*, 30*f* has been cut out of each latching member 29*d*, 29*f* forming a tooth 31*d* and 31*f*. The side 32*d* and 32*f* of each tooth has been beveled to assist the assembly of the guide device 40 onto the chassis 10. The feet 33 *d*, 33*e*, 33*f* of legs 34*d*, 34*e* and 34*f* which extend downward from the base 22 cooperate with latching members 29*d* and 29*f* to secure the guide device in the chassis 10.

Figure 4A:
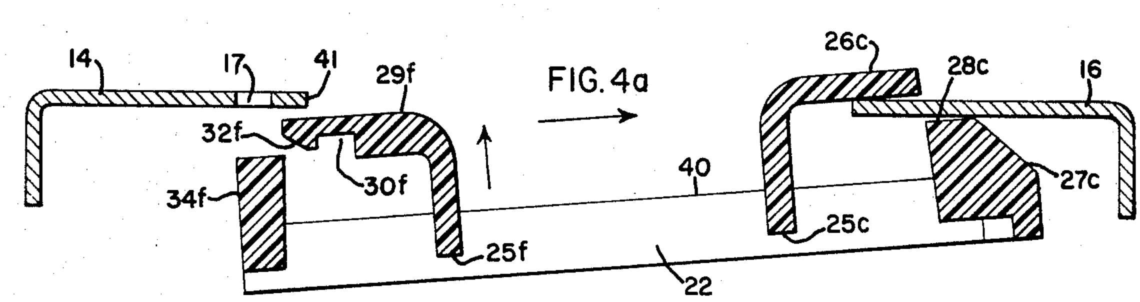
Figure 4B:
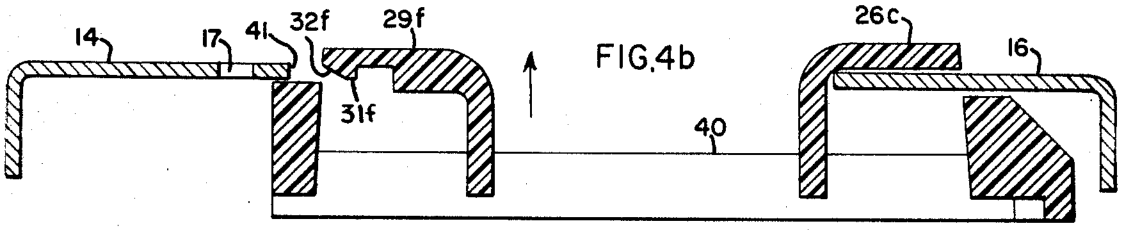
Figure 4C:
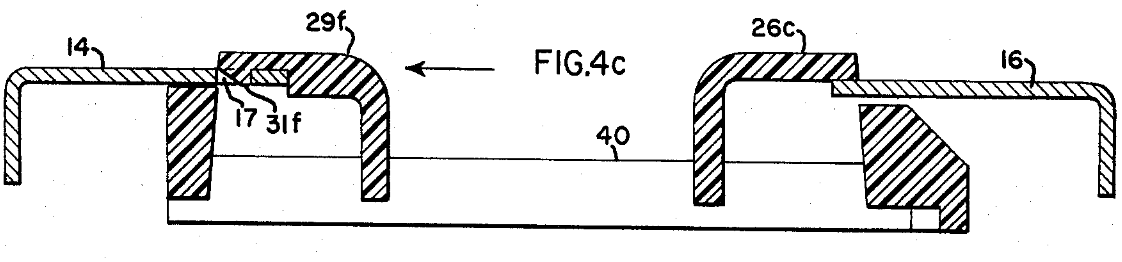

FIGS. 4*a*, 4*b* and 4*c* illustrate the assembly of the guide device 40 depicted in FIGS. 2 and 3 into the chassis 10 of FIG. 1. Since FIGS. 4*a*, 4*b* and 4*c* show only a cross-sectional view of the guide device 40, it will be appreciated that the non-depicted elements of the guide device 40 similarly cooperate with the chassis during the assembly and retention of the guide device into the chassis 10. As shown in FIG. 4*a*, the guide device 40 is placed on the angled frame member 16 so that the angled frame member 16 is interposed between restraining member 26*c* on one side and the restraining surface formed by foot 28*c* on the other side. The guide device 40 is then moved to the right and upward until it is in the position shown in FIG. 4*b*. The guide device 40 is then moved to the left so that a force is applied to the beveled side 32*f* of tooth 31*f* by the edge 41 of slotted frame member 14. The force on tooth 31*f* causes the latching member 29*f* to move away from the base 22 to clear the edge 41 of the slotted frame member 14.

When the guide device 40 is positioned as shown in FIG. 4*c* by moving it to the left from the position shown in FIG. 4*b*, the latching member 29*f* will spring back to its original position causing tooth 31*f* to engage slot 17 thereby securing the guide device 40 in the chassis.

In the assembled position, the engagement of the teeth 31*d*, 31*f* in the slots 17 resists any forces on the guide device 30 which tend to move it in a plane parallel to its base. The cooperation between the feet 28*a*, 28*b*, 28*c*, 33*d*, 33*e*, 33*f* and the latching members 29*d* and 29*f* and the restraining members 26*a* and 26*c* resists forces on the guide device 20 in a direction perpendicular to the plane of its base.

The card guide is molded from a suitable plastic material such as Lexan having the proper lubricity, strength and flexibility to align, support and guide the printed circuit boards.

From the foregoing discussion, it is apparent that the board guide of this invention can be easily installed in equipment in the field. The particular latching means described secures the board guide to the chassis without exerting any substantial continuous force on the guide device after it has been assembled in the chassis. The latching members and the restraining members of the board guide cooperate with the chassis to prevent accidental removal of the board guides due to forces applied on the board guide along any one of the principal axes of its base.

While the present invention has been described with reference to a specific embodiment thereof, it will be obvious to those skilled in the art that various changes and modifications may be made without departing from the invention in its broader aspects. For example, a single latching member could be employed instead of the two as described herein. It is contemplated in the appended claims to cover all variations and modifications of the invention which come within the true spirit and scope of the invention.

We claim:

1. A guide device for positioning a printed circuit board in operative engagement with an electrical connector, said guide device being adapted to be mounted on a chassis including a pair of spaced frame members, one of said frame members having positioning slots therein, said guide device comprising:

a. a generally flat base member having a first restraining surface and having a printed circuit board edge receiving channel extending across a first surface thereof, said channel being slightly wider than the thickness of the printed circuit board;

b. an L-shaped deflectable latch member, the first leg of said L-shaped latching member extending from said second surface, the second leg of said L-shaped latching member being notched to form a tooth at the end thereof, said first restraining surface and said latching member second leg cooperating at opposed surfaces of said slotted support member to latch said guide device to said support member by the engagement of said tooth in one of said slots; and c. a restraining member extending from said second surface of said base member and cooperating with said other support member to prevent substantial motion of the guide device when a force is applied thereto perpendicular to said second surface after the guide device has been latched to said support member.

2. A guide device as recited in claim 1 wherein said base has at least two parallel board edge receiving channels.

3. A guide device as recited in claim 1 wherein the base member includes a second restraining surface and wherein the restraining member is L-shaped, the first leg of said restraining member extending from said second surface, said second restraining surface and the second leg of said restraining member acting on opposed surfaces of said other support member to resist a force applied to the guide device in a direction perpendicular to the second surface of said base when said guide device is latched into said slotted support member.

4. A guide device as recited in claim 3 wherein legs extend from the base, the feet of said legs providing said first and second restraining surfaces.

5. A guide device as recited in claim 4 wherein one end of each board receiving channel terminates in a throat portion, said throat portion being substantially wider than the thickness of said printed circuit boards to assist the placement of said board in said channel.

6. An improved assembly for housing circuit board assemblies having electrical contacts thereon comprising:

a. a chassis comprising a pair of end plates, a pair of angled support members attached to said end plates and a pair of frame members attached to said end plates, said angled support members having latching slots in one angle leg;

b. electrical connectors fastened to the other angle leg of said support members, said electrical connectors having wiring terminals electrically connected to contacts housed therein;

c. guide devices mounted on said chassis for guiding the contacts on said printed circuit board into the contacts in said electrical connector and for maintaining a fixed relation between said inserted printed circuit board and said electrical connector, one of said guide devices comprising:

i. a generally flat base member having a first restraining surface and having a printed circuit board edge receiving channel extending across a first surface thereof, said channel being slightly wider than the thickness of the printed circuit board;

ii. an L-shaped deflectable latch member, the first leg of said L-shaped latch member extending from said second surface, the second leg of said L-shaped latching member being notched to form a tooth at the end thereof, said first restraining surface and said latching member second leg cooperating at opposed surfaces of said slotted support member to latch said guide device to said support member by the engagement of said tooth in one of said slots; and iii. a restraining member extending from said second surface of said base member and cooperating with one of said frame members to prevent substantial motion of the guide device when a force is applied thereto perpendicular to said second surface after the guide device has been latched to said one angled support member.

* * * * *